(12) United States Patent
Chang et al.

(10) Patent No.: US 6,372,610 B1
(45) Date of Patent: Apr. 16, 2002

(54) METHOD FOR DIE SEPARATION OF A WAFER BY ION IMPLANTATION

(75) Inventors: Fuh-Yu Chang, TaiChung; Shao-Heng Chang, Taipei; Hung-Yi Lin, Hsinchu, all of (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/500,790

(22) Filed: Feb. 10, 2000

(51) Int. Cl.$^7$ ................................ H01L 21/46
(52) U.S. Cl. ............... 438/460; 438/464; 438/465; 438/33; 438/113
(58) Field of Search .................. 438/460, 461, 438/462, 463, 464, 465, 924, 33, 68, 113

(56) References Cited

U.S. PATENT DOCUMENTS

| | | | |
|---|---|---|---|
| 5,266,528 A | * 11/1993 | Yamada | 437/226 |
| 5,374,564 A | * 12/1994 | Bruel | 437/24 |
| 5,559,043 A | * 9/1996 | Bruel | 437/24 |
| 5,609,148 A | * 3/1997 | Mitwalsky et al. | 125/16.01 |
| 5,614,445 A | * 3/1997 | Hirabayashi | 437/226 |
| 6,083,324 A | * 7/2000 | Henley et al. | 148/33.2 |
| 6,140,210 A | * 10/2000 | Aga et al. | 438/458 |
| 6,214,427 B1 | * 4/2001 | Levinson | 428/43 |
| 6,222,181 B1 | * 4/2001 | Ichigaya | 250/231.13 |
| 6,225,192 B1 | * 5/2001 | Aspar et al. | 438/460 |
| 6,225,193 B1 | * 5/2001 | Simpson et al. | 438/460 |
| 6,271,101 B1 | * 8/2001 | Fukunaga | 438/455 |

FOREIGN PATENT DOCUMENTS

| | | | | |
|---|---|---|---|---|
| FR | 2775831 A1 | * 3/1998 | | H01L/21/84 |
| JP | 01246875 A | * 2/1989 | | H01L/21/76 |

* cited by examiner

*Primary Examiner*—Caridad Everhart
*Assistant Examiner*—Renzo N. Rocchegiani
(74) *Attorney, Agent, or Firm*—Troxell Law Office PLLC

(57) ABSTRACT

This invention is a method for die separation of a wafer by ion implantation, wherein the die spacing is reduced and the die separation precision reaches a sub-micron level. The separated dies are obtained by wafer splitting after heat treatment and have cleavage roughness at a nano-meter level. The process method comprises the steps of: placing a wafer into an ion implanter; implanting gaseous ions into the split lines of said wafer with assistance of a mask; performing heat treatment of said wafer that is to split at the split lines; and completing die separation.

7 Claims, 5 Drawing Sheets

METHOD FOR DIE SEPARATION OF A WAFER BY ION IMPLANTATION

BACKGROUND OF THE INVENTION

1. Field of the Invention

The present invention generally relates to a method for die separation of a wafer by ion implantation, and more particularly, to a method for die separation, wherein the die spacing is reduced and the die separation precision reaches a sub-micron level.

2. Description of the Prior Art

Recently, die separation of brittle wafers has been a basic packaging operation essential for silicon-based semiconductor devices (such as ICs and solar cells) and opto-electronic semiconductor devices (such as LEDs and laser diodes). The general die separation process used nowadays is implemented by mechanical grinding with an electroplated cutting wheel or an electroplated dicing blade. Such knowledge is disclosed, for example, in U.S. Pat. No. 5,609,148, "Method and apparatus for dicing semiconductor wafers," filed by Mitwalsky and Alexander at Siemens Aktiengesellschaft (Munich, DE), and Okumura and Katsuya at Kabushiki Kaisha Toshiba (JP), in which the wafer is bowed or bent by forcing it into contact with a spherical surface having parallel grooves therein and in which an array of parallel wire saws that are in registration with the grooves is forced against the wafer for sawing parallel channels therethrough.

Nevertheless, in the prior arts discussed above, die separation process is realized by using a mechanical grinding method, which has suffered from the following drawbacks.

1. The die spacing is always more than 20 microns, and more particularly, the die spacing accomplished by using an electroplated cutting wheel is more than 40 microns, therefore a considerable area on the wafer has to be preserved for die separation process when the layout is being designed. During the past two decades, the manufacturers have made lots of efforts to minimize the critical dimension in order to reduce the manufacturing cost and enhance their competence. However, due to the large area sacrificed for scribe lines that can not be further minimized, the number of separated dies is limited on each wafer and therefore the manufacturing cost can not be reduced.

2. The speed of die separation is low by mechanical grinding since the scribe lines are created one by one and can not be accomplished at the same time.

3. A great amount of contaminants and undesired particles may be generated during die separation by mechanical grinding with an electroplated cutting wheel and contaminate the device and thus reduce the yield.

4. For any substrate that has been deposited with thin films, there exists strain at the interface, due to the different lattice constants of the junction materials, which leads to warpage. For example, structures of more than twenty layers deposited on an 8-inch wafer and patterned to define the IC layouts that are used to accomplish complicated ICs such as microprocessors and DRAMs generally have a warpage value of tens of microns. Such 8-inch wafer may suffer from warpage larger than one hundred microns after back grinding process. Under strain and warpage to such level, die separation process by mechanical grinding usually leads to wafer cracking and greatly affects the yield.

Accordingly, die separation process realized by mechanical grinding has suffered from several problems that can not be solved. Therefore, it is urgent to develop other die separation techniques to replace mechanical grinding to avoid the mentioned drawbacks. On the other hand, M. Kaminsky proposed in IEEE Trans. Nucl. Sci. MS-18 (1971) 208 that gaseous ions implanted into metal lead to formation of micro-bubbles. Such knowledge was later used in the design of a nuclear reactor since the a particles, i.e. helium ions ($He^+$), generated from the nuclear reactor constantly bombard the inner wall of the reactor and cause flaking or exfoliation of the wall metal, which strikes the nuclear industry heavily. For more detailed description, please refer to articles in Radiat. Eff. 53 (1980) 257 by S. K. Das and in Nucl. Instr. and Meth. 209/210 (1983) 333 by R. G. Saint Jacques.

Implanted gaseous ions do not only lead to metal flaking but also cause semiconductor exfoliation between layers. Such knowledge is disclosed, for example, in Nuclear Instruments and Methods in Physics Research B 108 (1996) 313–319 by M. Bruel and in Materials Science and Engineering B46 (1997) 14–19 by C. Maleville. Hydrogen ion implantation into semiconductor wafer causes layer splitting after heat treatment and thus leads to formation of high quality silicon-on-insulator (SOI) structure. The principle of this process involves the basic mechanism associated with a mass of hydrogen ions implanted into semiconductor wafer. Thermal treatment leads to formation of micro-bubbles that swell and cause layer splitting of the semiconductor wafer.

SUMMARY OF THE INVENTION

Accordingly, it is an object of the present invention to provide a method for die separation of a wafer by ion implantation.

Moreover, it is another object of the present invention to provide a method for die separation of a wafer by ion implantation, wherein the die spacing is reduced and the die separation precision reaches a sub-micron level.

In order to accomplish the foregoing objects, the present invention relates to a method for die separation of a wafer by ion implantation, wherein the die spacing is reduced and the die separation precision reaches a sub-micron level. The separated dies are obtained by wafer splitting after heat treatment and have cleavage roughness at a nano-meter level. The process method comprises the steps of: placing a wafer into an ion implanter; implanting gaseous ions into the split lines of said wafer with assistance of a mask, wherein said gaseous ions can be hydrogen ions or helium ions that do not chemically react with said wafer; performing heat treatment of said wafer that is to split at the split lines; and completing die separation.

Said heat treatment is carried out in the temperature ranging from 100 to 600° C., depending on the dosage of said gaseous ions. In order to meet the requirement for lower thermal budget, the temperature for heat treatment does not need to be high (lower than 250° C.) to make said wafer split when the dosage of the implanted gaseous ions is relatively high (higher than $1E17\ cm^{-2}$). On the contrary, if the dosage of implanted gaseous ions is relatively low, higher temperature is required to make said wafer split.

The disclosure of the present invention is advantageous in that the die spacing is reduced and the die separation precision reaches a sub-micron level, which can enhance the competence of the products by a lower manufacturing cost resulted from a larger number of separated dies fabricated on each wafer. Moreover, in the method proposed in the present invention, die separation operation is processed at the same time, which avoids the wafer from cracking due to the prevention of strain caused by mechanical grinding, and furthermore, the yield can be improved.

BRIEF DESCRIPTION OF THE DRAWINGS

The objects, spirits and advantages of the preferred embodiment of the present invention will be readily understood by the accompanying drawings and detailed descriptions.

DETAILED DESCRIPTION OF THE INVENTION

The present invention relates to a method for die separation of a wafer by ion implantation. Such method is suitable for die separation of all kinds of wafers, and also applicable to the packaging operation for silicon-based semiconductor devices (such as ICs, solar cells) and opto-electronic semiconductor devices (such as LEDs and laser diodes).

Figure 1:
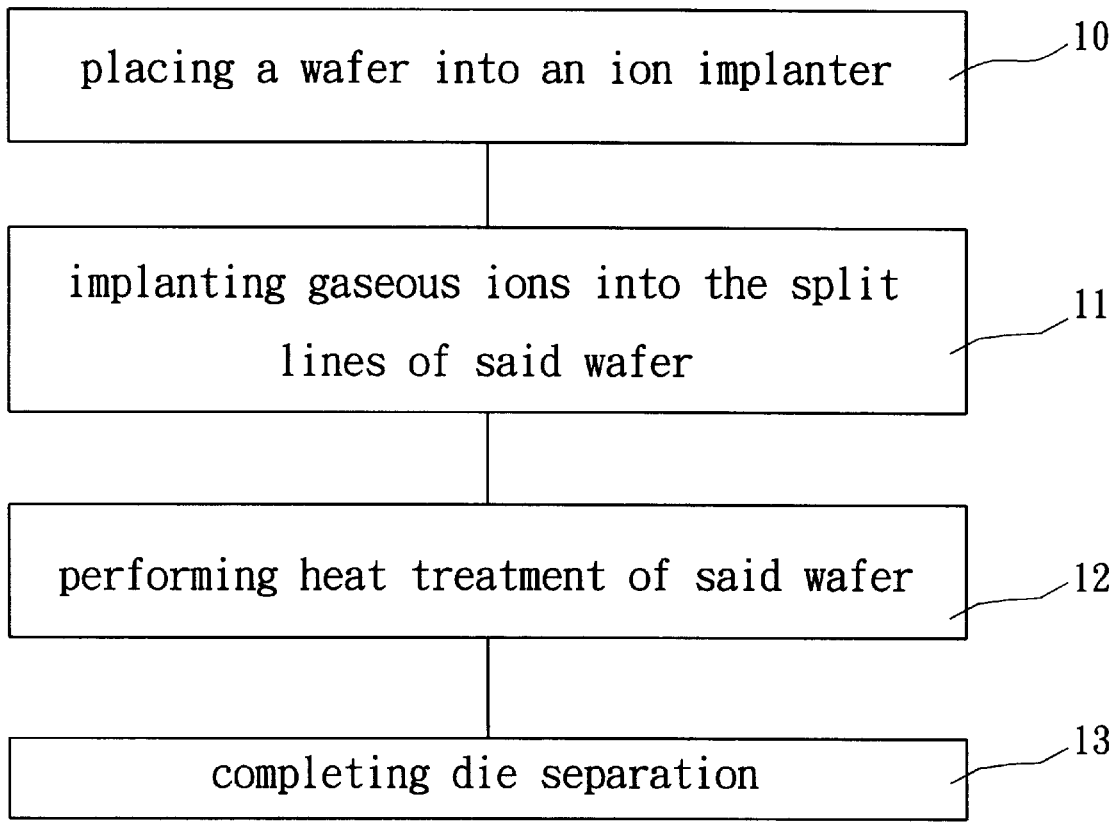
FIG. 1 is a flow chart illustrating the process steps of the die separation method by ion implantation in accordance with the embodiment of the present invention.

Please refer to FIG. 1, which is a flow chart illustrating the process steps of the die separation method by ion implantation in accordance with the embodiment of the present invention. As shown in the flow chart, the die separation method comprises the steps of: placing a wafer into an ion implanter 10; implanting gaseous ions into the split lines of said wafer with assistance of a mask 11; performing heat treating of said wafer that is to split at the split lines 12; and completing die separation 13.

Figure 2:
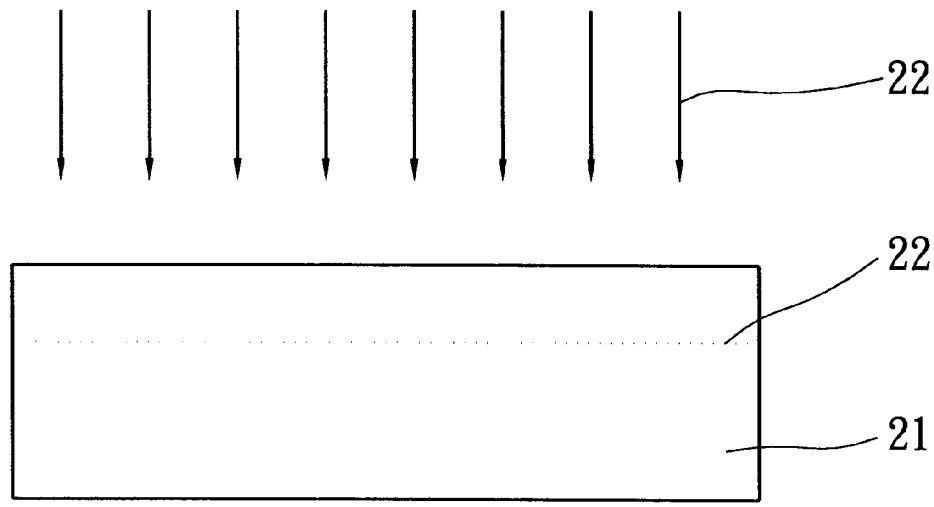
FIG. 2A is a cross-section view illustrating the step of implanting gaseous ions into the split lines of said wafer by ion implantation in accordance with the embodiment of the present invention.
FIG. 2B is a top view illustrating the step of implanting gaseous ions into the split lines of said wafer by ion implantation in accordance with the embodiment of the present invention.
Figure 2:
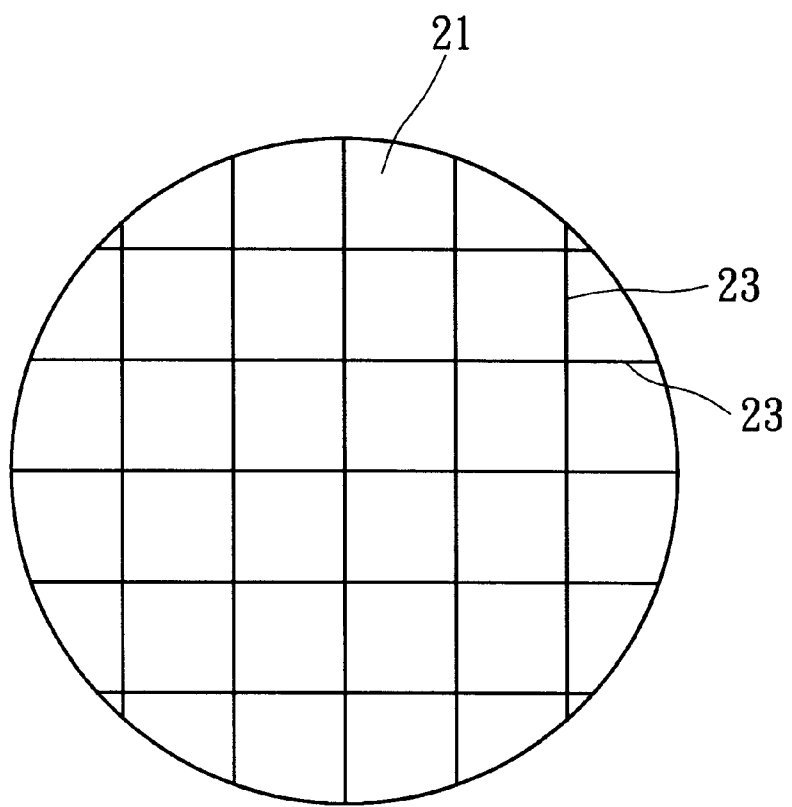

The preferred embodiment will be described with an example of an 8-inch silicon wafer. The 8-inch silicon wafer has a thickness of 725 microns ($\mu m$), a thickness of 735 $\mu m$ after being processed, and a thickness ranging from 200 $\mu m$ to 300 $\mu m$ after being back ground. Please further refer to FIG. 2A and FIG. 2B, which show the step of implanting gaseous ions into the split lines of said wafer by ion implantation in accordance with the embodiment of the present invention. FIG. 2A is related to the cross-section view and FIG. 2B is related to the top view. An ion implanter is used in the embodiment of the present invention to implant the hydrogen ions 22 into the split lines 23, having an implantation energy ranging from 40 to 1000 kilo electron volts (KeV), resulting in an implantation depth of 0.6 to 100 $\mu m$, wherein the optimal implantation energy is 200 KeV; and an implantation dosage ranging from 5E15 to 5E17 $cm^{-2}$, wherein the optimal implantation dosage is 8E16 $cm^{-2}$.

Moreover, the proposed method is not limited by or in die separation of silicon wafer. Such method is also applicable to die separation of opto-electronic semiconductor wafers such as GaAs, InP, GaP wafers and thin flm transistor-liquid crystal display (TFT-LCD) used glass substrates, be it crystalline or amorphous.

Figure 3:
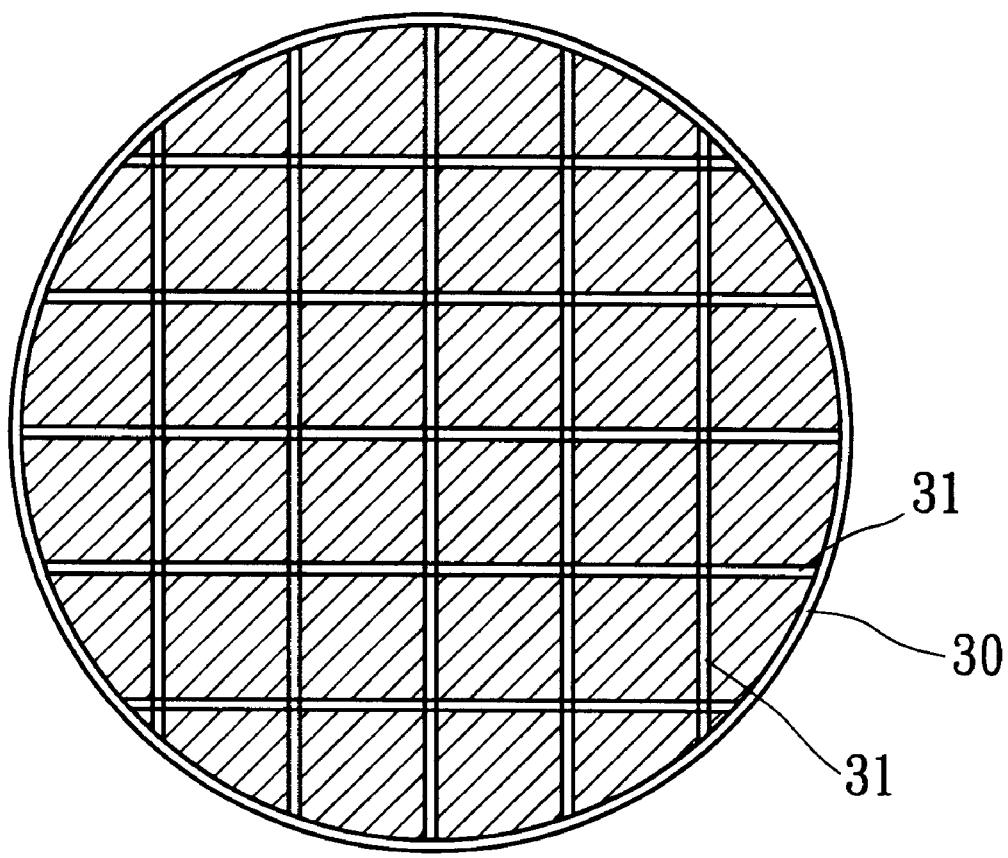
FIG. 3A is a schematic diagram illustrating a mask for use in the embodiment of the present invention.
FIG. 3B is a 3-dimensional schematic diagram illustrating the step of implanting gaseous ions into said wafer to form strip or network patterns with assistance of a mask by ion implantation in accordance with the embodiment of the present invention.
Figure 3:
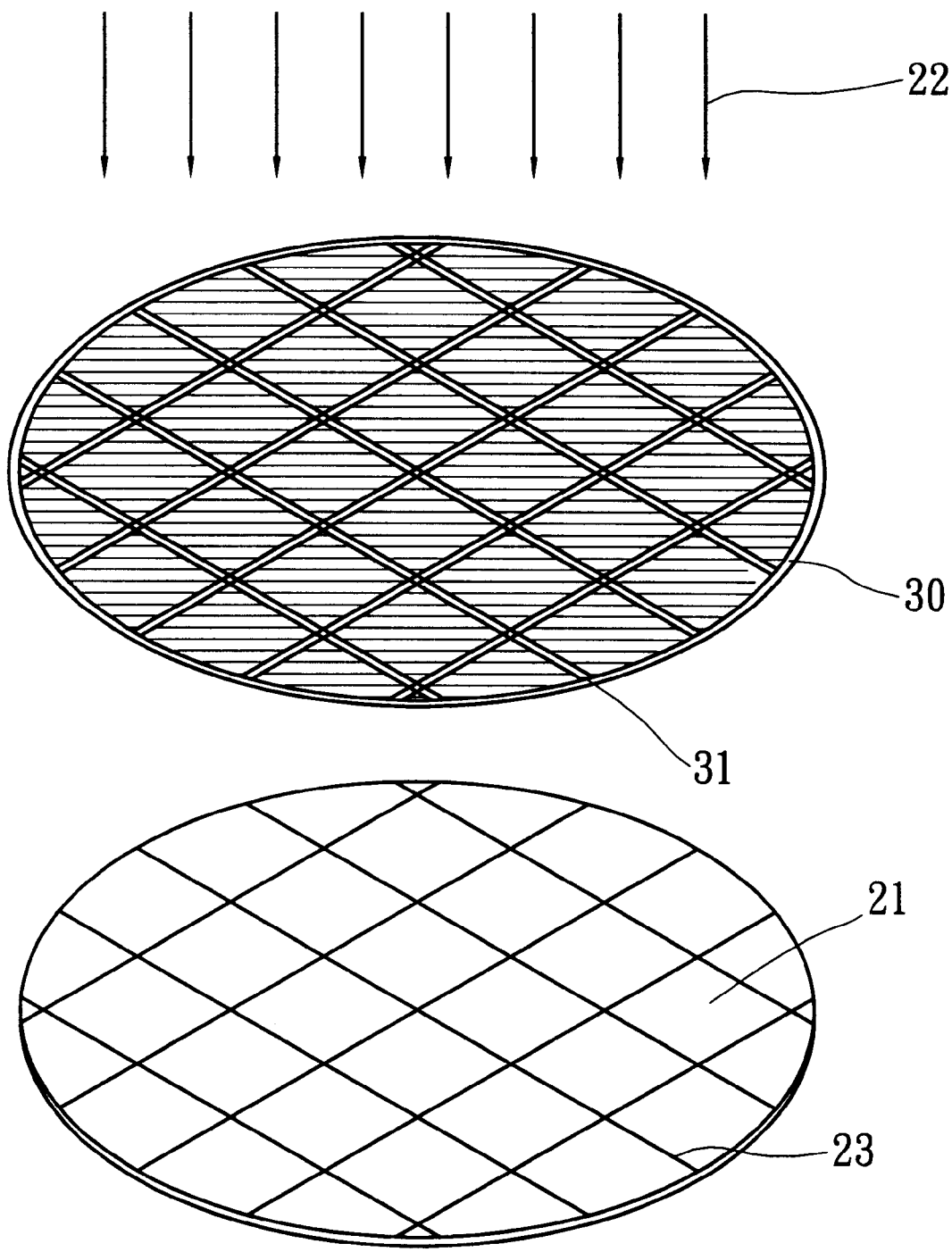

In order to confine the hydrogen ion beams into the split lines of the wafer instead of the other undesired region, the proposed method uses a mask with its structure characterized in strip or network patterns, through which only the ions implanted into the split lines can pass. In this manner, the ions impacting on the die region of the mask 30 are all scattered back. Accordingly, the gaseous ions are implanted into the split lines of the wafer in strip or network patterns. The mask mentioned above is shown in FIG. 3A, wherein the transparent area 31 corresponds to the split lines of the wafer. Said mask 30 can be fabricated by using metal or other materials that can stop gaseous ions from passing through. FIG. 3B is a 3-dimensional schematic diagram illustrating the step of implanting gaseous ions into said wafer to form strip or network patterns with assistance of a mask by ion implantation in accordance with the embodiment of the present invention.

Figure 4:
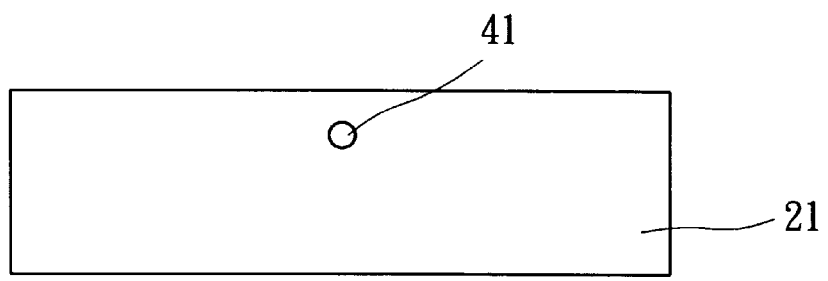
FIG. 4A is a cross-section view illustrating the micro-bubble formation due to the implanted hydrogen ions in the split lines after heat treatment of said wafer in accordance with the embodiment of the present invention.
FIG. 4B is a cross-section view, in which the pressure of the micro-bubble splits said wafer at the split lines after heat treatment in accordance with the embodiment of the present invention.
FIG. 4C is a schematic diagram illustrating the completed die separation process in accordance with the embodiment of the present invention, wherein each square represents a die.
Figure 4:
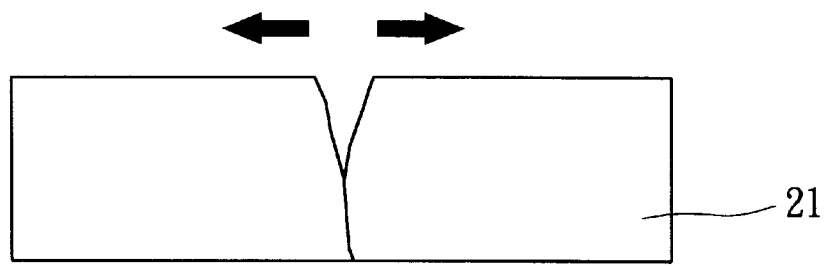
Figure 4:
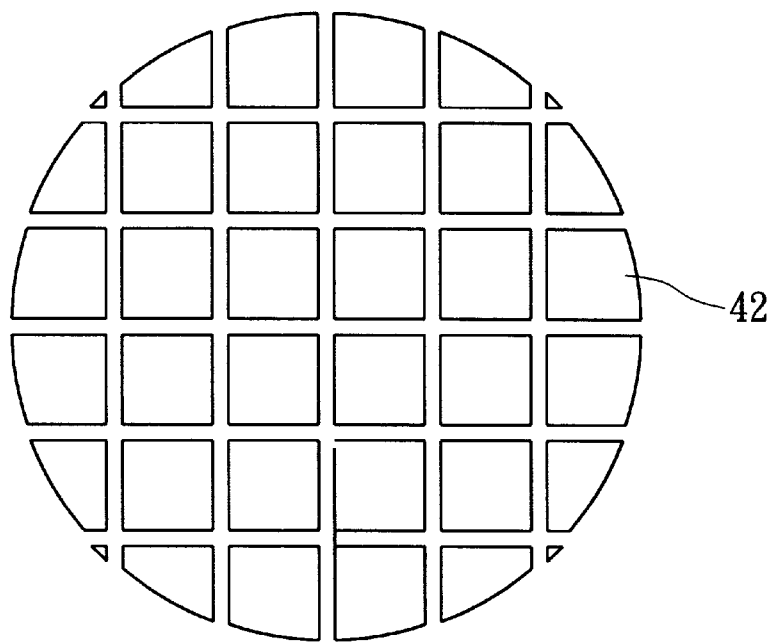

After heat treatment, said wafer splits at the split lines and thus the die separation process is completed. Said heat treatment can be performed by using a heating plate, heating gas, an IR heater, or a laser source. After heat treatment, the hydrogen ions implanted into the split lines lead to formation of micro-bubbles 41, as can be seen in FIG. 4A. The micro-bubbles represent the gas phase region, in which point defects, line defects, plane defects and bulk defects form in response to different species, dopings, energies of the implanted gaseous ions. As the temperature increases, the micro-bubbles swell and the pressure raises to split said wafer at the split lines, as shown in FIG. 4B. FIG. 4C shows the completed die separation process, wherein each square represents a die.

Said heat treatment is carried out in the temperature ranging from 100 to 600° C., depending on the dosage of said gaseous ions. In order to meet the requirement for lower thermal budget, the temperature for heat treatment does not need to be high (lower than 250° C.) to make said wafer split when the dosage of the implanted gaseous ions is relatively high (higher than 1E17 $cm^{-2}$). On the contrary, if the dosage of implanted gaseous ions is relatively low, higher temperature is required to make said wafer split. In accordance with the preferred embodiment of the present invention, for a back ground 8-inch silicon wafer, the implantation energy is 200 KeV; the implantation dosage is 8E16 $cm^{-2}$, and the temperature for said heat treatment is 250° C.

Based on the fact that the temperature for said heat treatment has strong relation with implantation dosage of the gaseous ions, the parameters associated with temperature and implantation dosage thus become very important. For example, the melting point of aluminum is 659.7° C., however, is as the temperature increases over 400° C., the aluminum structure starts to change in phase. Therefore, when using aluminum for metal interconnection, the temperature for heat treatment of an IC can not be above 400°

C. Consequently, the implantation dosage of the gaseous ions for die separation can not be too low.

Moreover, in addition to hydrogen, helium or other species of gas can also be used as an implantation source, which can not chemically react with the wafer at high temperature. For example, oxygen can not be chosen as an implantation source, otherwise oxygen ions may chemically react with the silicon wafer and form silicon dioxide.

Since the proposed method uses a mask to precisely implant the gaseous ions generated from an ion implanter into the split lines of said wafer and then make said wafer split after heat treatment, the die spacing is reduced and the die separation precision reaches a sub-micron level and the cleavage roughness reaches a nanometer level. Accordingly, the disclosed method of the present invention has advantages as described below:

1. The die spacing is reduced to a sub-micron level, providing a larger area for IC design, which results in a larger amount of dies and lower manufacturing cost.
2. The yield of die separation is improved since the cleavage roughness reaches a nano-meter level.
3. The yield of die separation is further improved since there is no strain induced from patterned thin films that causes wafer cracking.
4. The speed of die separation is improved by the disclosed method, unlike the mechanical grinding method, in which the scribe lines are created one by one and can not be accomplished at the same time.
5. The yield of die separation is further improved since there is no contaminant and undesired particle generated during die separation by mechanical grinding.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A method of separating a wafer into a plurality of dies, comprising the steps of:
   a) providing a wafer having opposite surfaces bounding a thickness of the wafer;
   b) placing the wafer in an ion implanter;
   c) implanting gaseous ions in the wafer between the opposite surfaces such that the ions are arranged in a network pattern of intersecting lines forming separation lines for the plurality of dies wherein the gaseous ions do not chemically react with the wafer; and,
   d) heat treating the wafer to cause the wafer to split through the thickness along the network of intersecting lines thereby forming a plurality of dies.

2. The method for die separation of a wafer by ion implantation as recited in claim 1, wherein said gaseous ions are provided by a hydrogen source.

3. The method for die separation of a wafer by ion implantation as recited in claim 1, wherein said gaseous ions are provided by a helium source.

4. The method for die separation of a wafer by ion implantation as recited in claim 1, wherein implantation energy of said gaseous ions ranges from 40 to 1000 kilo electron volts (KeV).

5. The method for die separation of a wafer by ion implantation as recited in claim 1, wherein implantation dosage of said gaseous ions ranges from 5E15 to 5E17 $cm^{-2}$.

6. The method for die separation of a wafer by ion implantation as recited in claim 1, wherein temperature for the heat treating is related to an implantation dosage of said gaseous ions and ranges from 100 to 600° C.

7. The method of claim 1 comprising the additional step of placing a mask between an ion source in the ion implanter and the wafer, the mask having transparent areas allowing ion passage arranged in a network of intersecting lines.

* * * * *